(12) United States Patent  
Raman et al.

(10) Patent No.: US 12,205,791 B2  
(45) Date of Patent: Jan. 21, 2025

(54) RATING SUBSTRATE SUPPORT ASSEMBLIES BASED ON IMPEDANCE CIRCUIT ELECTRON FLOW USING MACHINE LEARNING

(71) Applicant: APPLIED MATERIALS, INC., Santa Clara, CA (US)

(72) Inventors: Arvind Shankar Raman, Corvallis, CA (US); Harikrishnan Rajagopal, Santa Clara, OR (US); John Forster, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1033 days.

(21) Appl. No.: 17/158,811

(22) Filed: Jan. 26, 2021

(65) Prior Publication Data

US 2022/0238300 A1 Jul. 28, 2022

(51) Int. Cl.
| | | |
|---|---|---|
| *H01J 37/244* | (2006.01) | |
| *G01R 21/133* | (2006.01) | |
| *G01R 27/26* | (2006.01) | |
| *G06N 20/00* | (2019.01) | |
| *H01J 37/32* | (2006.01) | |
| *H01L 21/67* | (2006.01) | |
| *H01L 21/683* | (2006.01) | |
| *H04Q 9/00* | (2006.01) | |

(52) U.S. Cl.
CPC .......... *H01J 37/244* (2013.01); *G01R 21/133* (2013.01); *G01R 27/2617* (2013.01); *G06N 20/00* (2019.01); *H01J 37/32091* (2013.01); *H01J 37/32174* (2013.01); *H01J 37/32715* (2013.01); *H01L 21/67069* (2013.01); *H01L 21/67103* (2013.01); *H01L 21/6831* (2013.01); *H04Q 9/00* (2013.01); *H01J 2237/2007* (2013.01); *H01J 2237/24564* (2013.01); *H01J 2237/334* (2013.01); *H04Q 2209/43* (2013.01); *H04Q 2209/823* (2013.01)

(58) Field of Classification Search
CPC ...... G06N 20/00; H04Q 9/00; H04Q 2209/43; H04Q 2209/829; H01J 37/244; H01J 2237/2007; H01J 2237/24564; H01J 2237/334; H01L 21/6831
USPC ....................................................... 700/212
See application file for complete search history.

(56) References Cited

U.S. PATENT DOCUMENTS 11,062,920 B2 * 7/2021 Berry, III .......... H01L 21/67069  
2016/0244874 A1 * 8/2016 Ge ............................ H03J 7/04  
(Continued)

*Primary Examiner* — Md Azad  
(74) *Attorney, Agent, or Firm* — Lowenstein Sandler LLP

(57) ABSTRACT

Methods and systems for rating a current substrate support assembly based on impedance circuit electron flow are provided. Data associated with an amount of radio frequency (RF) power flowed through an electrical component of a current substrate support assembly during a current testing process performed for the current substrate support assembly is provided as input to a trained machine learning model. One or more outputs of the trained machine learning model are obtained. A measurement value for an electron flow across an impedance circuit of the current substrate support assembly is extracted from the one or more outputs. In response to a determination that the extracted measurement value for the electron flow satisfies an electron flow criterion, a first quality rating is assigned to the current substrate support assembly.

17 Claims, 8 Drawing Sheets

(56) References Cited

U.S. PATENT DOCUMENTS

| | | | |
|---|---|---|---|
| 2020/0083080 A1* | 3/2020 | Clark | H01L 21/7685 |
| 2021/0090859 A1* | 3/2021 | Bhutta | H01L 21/32136 |
| 2024/0096713 A1* | 3/2024 | Zhang | H01L 21/67253 |

* cited by examiner

RATING SUBSTRATE SUPPORT ASSEMBLIES BASED ON IMPEDANCE CIRCUIT ELECTRON FLOW USING MACHINE LEARNING

TECHNICAL FIELD

Embodiments of the present disclosure relate, in general, to manufacturing systems and more particularly to rating substrate support assemblies based on impedance circuit electron flow.

BACKGROUND

Substrate support assemblies are configured to support substrates during a process at a manufacturing system. Electrical components of a substrate support assembly can be damaged during manufacturing of the substrate support assembly or can be otherwise ineffective. As a result, substrates can be damaged during a process performed at a manufacturing system using a substrate support assembly with such electrical components.

SUMMARY

Some of the embodiments described cover a system and method for rating a substrate support assembly based on impedance circuit electron flow. The method includes providing, as input to a trained machine learning model, data associated with an amount of radio frequency (RF) power flowed through an electrical component of a current substrate support assembly during a current testing process performed for the current substrate support assembly. The method further includes obtaining one or more outputs of the trained machine learning model. The method further includes extracting, from the one or more outputs, a measurement value for an electron flow across an impedance circuit of the current substrate support assembly. The method further includes determining whether the extracted measurement value for the electron flow satisfies an electron flow criterion. In response to a determination that the extracted measurement value satisfies the electron flow criterion, the method includes assigning a first quality rating to the current substrate support assembly. In response to a determination that the extracted measurement value does not satisfy the electron flow criterion, the method includes assigning a second quality rating to the current substrate support assembly. The first quality rating can correspond to a higher quality substrate support assembly than a respective substrate assembly associated with the second quality rating.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Figure 1:
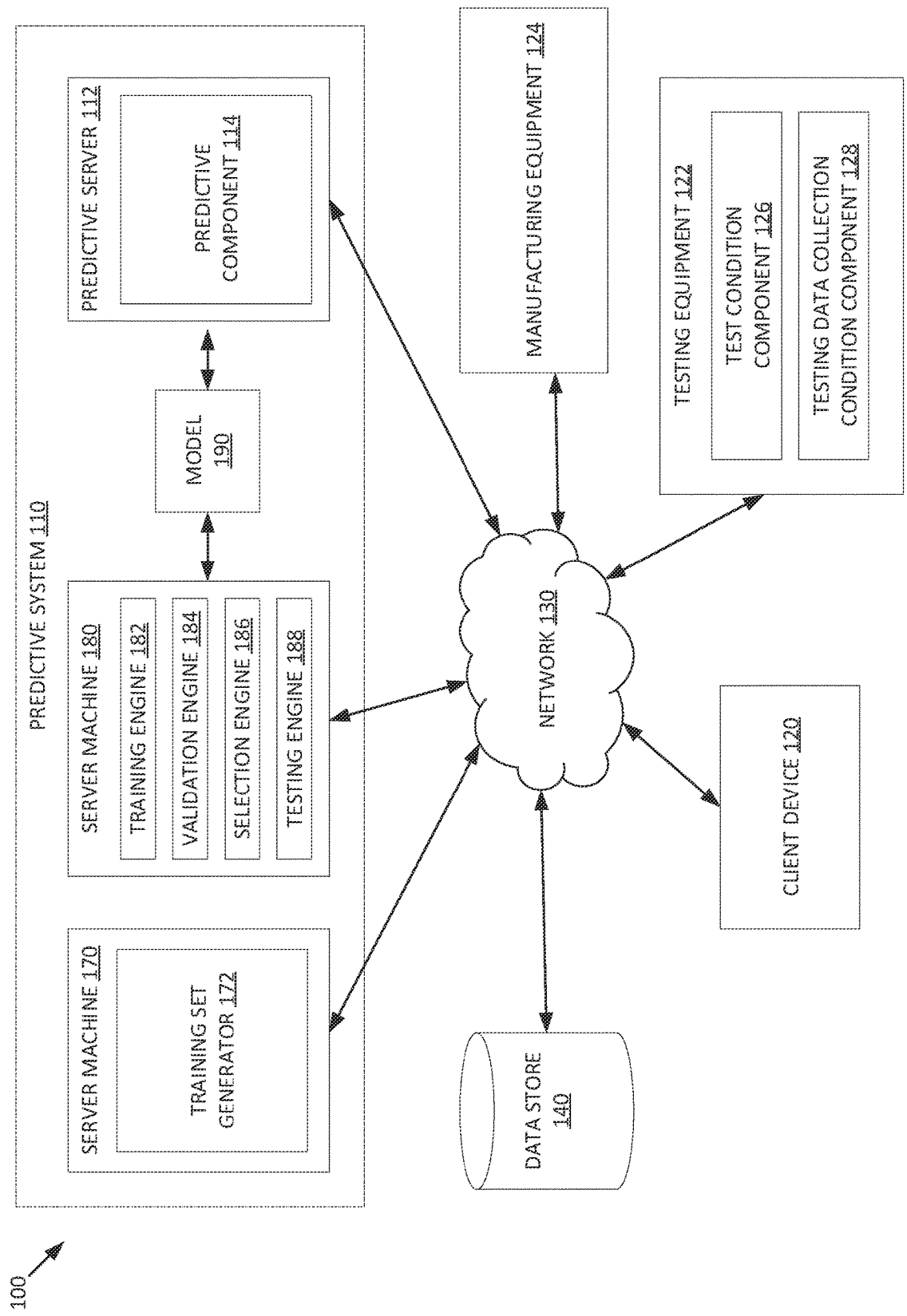
FIG. 1 depicts an illustrative computer system architecture, according to aspects of the present disclosure.

Implementations described herein provide systems and methods for rating substrate support assemblies based on impedance circuit electron flow. A substrate support assembly of a process chamber can support a substrate during a process performed at the process chamber. The substrate support assembly can include electrical components that are configured to perform various functions during the process. For example, the substrate support assembly can include an electrostatic chuck configured to electrostatically secure the substrate to a surface of the substrate support assembly. The electrostatic chuck can include electrodes that generate an electrostatic force between the substrate support assembly and the substrate. In another example, the substrate support assembly can include an electrode configured to transfer RF power to a process gas within the process chamber. The transferred RF power can cause the process gas to become a process plasma (e.g., an etching plasma, etc.), in accordance with a process recipe for the substrate. In yet another example, the substrate support assembly can include heating elements that are configured to heat the substrate to a target temperature during a process at the process chamber.

As can be seen above, substrate support assemblies can include various electrical components configured to perform different functions during a process performed for a substrate at a process chamber. In some instances, one or more electrical components can be defective or otherwise ineffective. For example, an electrode of the electrostatic chuck can be defective, which prevents the electrostatic chuck from generating a target electrostatic force to secure the substrate to the surface of the substrate support assembly. As a result, the substrate can be damaged during the process performed at the process chamber. In another example, another electrode of the substrate support assembly can be defective, which prevents the electrode from effectively and/or efficiently transferring RF power to a process gas within the process chamber. As a result, plasma is not generated according to the process recipe. In some instances, significant changes are made to the process recipe during the substrate process, which can delay the overall process performed at the process chamber and can use a significant amount of system resources (e.g., computer processing resources, process gas resources, RF power resources, etc.).

In some instances, a substrate support assembly including defective electrical components can be unusable in a process chamber of a manufacturing system. In other instances, a substrate support assembly including defective electrical components cannot be used for substrates that are subject to strict process conditions (e.g., an actual process condition at the process chamber is to be within 99.999% of a target value), but can be used in processes that are subject to lenient process conditions (e.g., an actual process condition at the process chamber is to be within 90% of a target value). However, users of a manufacturing system (e.g., operators) are unable to easily and effectively identify substrate support assemblies that include defective electrical components after the substrate support assembly is manufactured. As a result, substrate support assemblies including defective electrical components can be installed in process chambers for the manufacturing system, which can cause damage to substrates processed at the process chamber and/or other components of the process chamber. In some instances, the defective electrical components prevent a substrate from being processed according to a target process recipe and significant changes are made to the process recipe to account for the defective electrical components. As mentioned above, changes made to the process recipe can use a significant amount of system resources (e.g., computer processing resources, process gas resources, RF power resources, etc.), which can delay the overall process performed at the process chamber. The use of system resources and delay of the overall process can result in a significant increase in overall system latency and a decrease in overall system efficiency.

Aspects of the present disclosure address the above noted and other deficiencies by providing systems and methods for rating substrate support assemblies based on impedance circuit electron flow. A processing device of a testing system can provide, as input to a trained machine learning model, data associated with an amount of RF power flowed through an electrical component (e.g., an electrode, a heating element, etc.) of a substrate support assembly during a testing process. In some embodiments, the data associated with the amount of RF power flowed through the electrical component can include one or more scattering parameter values (e.g., a parameter value indicating an amount of RF power loss) for the electrical component. In some embodiments, the data associated with an amount of RF power can be collected by a testing fixture of the testing system, where the testing fixture is configured to simulate RF power flowed from electrodes of a process chamber to the electrical components of the substrate support assembly.

The machine learning model can be trained to predict a measurement value for an electron flow (i.e., a current) across an impedance circuit coupled to the substrate support assembly. An impedance circuit can be a circuit coupled to an RF power supply that is configured to maintain a particular amount of RF power transmitted to the electrical component of the substrate support assembly. The measurement value for the electron flow across the impedance circuit corresponds to an amount of ion energy at the substrate during a process at a process chamber, which can indicate a quality or effectiveness of the electrical components of the substrate support assembly. In some embodiments, the impedance circuit can be a component of an auto capacitance tuner.

The processing device of the testing system can obtain one or more outputs of the trained machine learning model and can extract the measurement value for the electron flow across the impedance circuit from the obtained outputs. In some embodiments, the processing device can determine whether the electron flow measurement satisfies an electron flow criterion. In response to determining that the electron flow criterion is satisfied (e.g., the electron flow measurement exceeds a threshold electron flow measurement value), the processing device can assign a first quality rating to the substrate support assembly. In response to determining that the electron flow criterion is not satisfied (e.g., the electron flow measurement does not exceed the threshold electron flow measurement value), the processing device can assign a second quality rating to the substrate support assembly. The first quality rating can be associated with a higher quality substrate support assembly than a respective substrate support assembly associated with the second quality rating.

In some instances, the assigned quality rating can indicate whether a substrate support assembly should be installed at a process chamber. For example, it can be determined (e.g., by a user of a manufacturing system (e.g., an operator)) that substrate support assemblies associated with a first quality rating are to be installed at process chambers of the manufacturing system while substrate support assemblies associated with the second quality rating are not to be installed at process chambers. In another example, it can be determined that substrate support assemblies associated with a first quality ratings are to be installed at process chambers for processes subject to strict process conditions while substrate support assemblies associated with second quality ratings are to be installed at process chambers for processes subject to lenient process conditions.

Aspects of the present disclosure address deficiencies of the conventional technology by providing systems and methods for providing a rating for a substrate support assembly based on the effectiveness of electrical components of the substrate support assembly after the substrate support assembly is constructed. Using data associated with a prior testing process performed for a prior substrate support assembly, the machine learning model can be trained to predict a measurement value for an electron flow across an impedance circuit of a current substrate support assembly. The processing device of the testing system can determine, based on the predicted electron flow measurement value, whether an electron flow criterion is satisfied and assign a respective quality rating to the substrate support assembly based on the determination.

By assigning the quality rating based on the predicted electron flow measurement, a substrate support assembly that includes defective electrical components can be identified before the substrate support assembly is installed at a process chamber. Determining to not install a substrate support assembly including defective electrical components at a process chamber, can, in some instances, prevent substrates from being damaged by the defective substrate support assembly. In other or similar instances, determining not to install the defective substrate support assembly can prevent the waste of significant system resources (e.g., computer processing resources, process gas resources, RF power resources) used to modify a process recipe to account for a defective electrical component. As a result, an overall system latency decreases and an overall system efficiency increases.

FIG. 1 depicts an illustrative computer system architecture 100, according to aspects of the present disclosure. Computer system architecture 100 can include a client device 120, a predictive server 112 (e.g., to generate predictive data, to provide model adaptation, to use a knowledge base, etc.), and a data store 140. The predictive server 112 can be part of a predictive system 110. The predictive system 110 can further include server machines 170 and 180. In some embodiments, computer system architecture 100 can be included as part of a manufacturing system for processing substrates, such as manufacturing system 200 of FIG. 2. In such embodiments, computer system architecture 100 can include manufacturing equipment 124 and/or testing equipment 122. In other or similar embodiments, computer system architecture 100 can be included as part of a testing system. In such embodiments, computer system architecture 100 may not include manufacturing equipment 124 and instead may include testing equipment 122.

Manufacturing equipment 124 can produce products, such as electronic devices, following a recipe or performing runs over a period of time. Manufacturing equipment 124 can include a process chamber, such as process chamber 300 described with respect to FIG. 3. Manufacturing equipment 124 can perform a process for a substrate (e.g., a wafer, etc.) at the process chamber. Examples of substrate processes include a deposition process to deposit a film on a surface of the substrate, an etch process to form a pattern on the surface of the substrate, etc. Manufacturing equipment 124 can perform each process according to a process recipe. A process recipe defines a particular set of operations to be performed for the substrate during the process and can include one or more settings associated with each operation. For example, a deposition process recipe can include a temperature setting for the process chamber, a pressure setting for the process chamber, a flow rate setting for a precursor for a material included in the film deposited on the substrate surface, etc.

Testing equipment 122 can provide testing data associated with one or more components of manufacturing equipment 124 (e.g., a substrate support assembly, etc.). It should be noted that although embodiments of the present disclosure refer to testing a substrate support assembly, embodiments of the present disclosure can be applied to any substrate support assembly. Testing data refers to data collected by testing equipment 122 during performance of one or more operations of a testing process for a substrate support assembly. In some embodiments, testing equipment 122 can include a processing device and a memory component. In some embodiments, the memory component of testing equipment 122 can be included at data store 140. In other or similar embodiments, the memory component of testing equipment 122 can be separate from data store 140. The memory component can be configured to store the one or more operations of the testing process for the substrate support assembly and the processing device of testing equipment 122 can be configured to execute the testing process operations.

In some embodiments, testing equipment 122 can further include one or more testing condition components 126. The processing device of testing equipment 122 can cause one or more conditions to be applied during a testing process performed for the substrate support assembly. For example, a test condition component 126 can include a radio frequency (RF) power component that is configured to deliver RF power to one or more electrical components of the substrate support assembly during a testing process performed by testing equipment 122. The processing device of testing equipment 122 can transmit instructions to the RF power component that cause the RF power component to provide a particular amount of RF power to the electrical components of the substrate support assembly during the testing process.

In some embodiments, testing equipment 122 can further include one or more testing data collection components 128. A testing data collection component 128 can include sensors configured to collect the testing data for the substrate support assembly during the testing process and transmit the collected data to the processing device of testing equipment 122. In accordance with the previous example, a testing data collection component 128 can include a RF power sensor configured to monitor an amount of power flowed through an electrical component of the substrate support assembly during the testing process performed by testing equipment 122. The RF power sensor can detect the amount of RF power flowed through the electrical component during the testing process and transmit data associated with the detected amount of RF power to the processing device of testing equipment 122. In response to receiving the testing data from the RF power sensor, the processing device of testing equipment 122 can store the testing data at the memory component for testing equipment 122.

Figure 5:
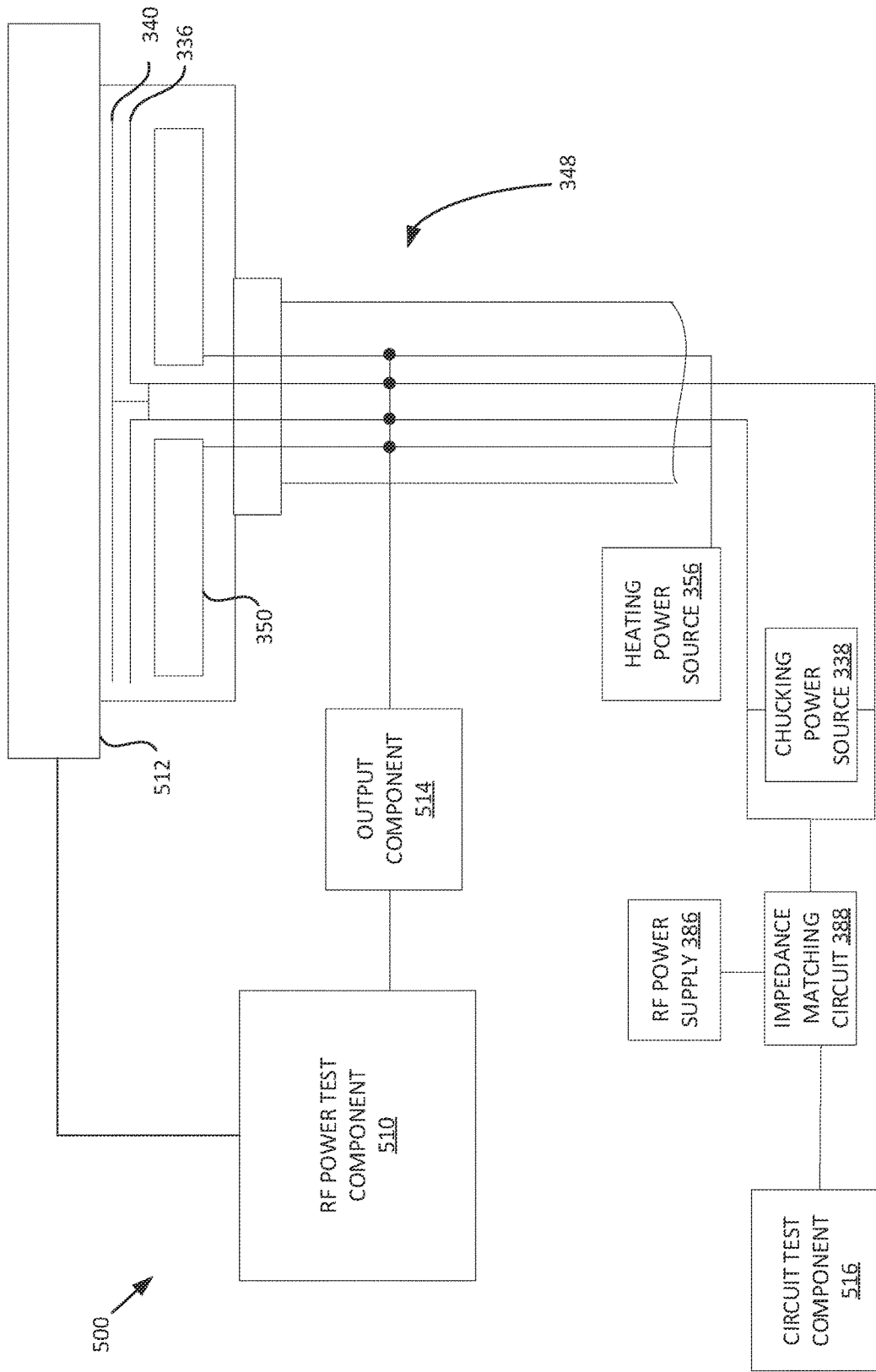
FIG. 5 illustrates example testing equipment coupled to components of a substrate support assembly, according to aspects of the present disclosure.

In some embodiments, test condition component 126 and testing data collection component 128 of testing equipment 122 can be included as part of a testing fixture, such as testing fixture 500 of FIG. 5, that is coupled to the processing device of testing equipment 122. In other or similar embodiments, one or more testing condition component 126 and one or more testing data collection components 128 can be included as part of the testing fixture and one or more additional testing data collection components 128 can be separate from the testing fixture. For example, the testing fixture can include a RF power component configured to deliver RF power to a substrate support assembly and a RF power sensor configured to monitor the amount of RF power flowed through the component. Testing equipment 122 can further include an electron flow sensor (i.e., a current monitor) configured to monitor and generate a measurement value for an electron flow across an impedance circuit for the substrate support assembly during the testing process. The electron flow monitor can be separate from the testing fixture that includes the RF power component and the RF power sensor. Further details about testing fixtures are provided with respect to FIG. 5.

The client device 120 my include a computing device such as personal computers (PCs), laptops, mobile phones, smart phones, tablet computers, netbook computers, network connected televisions ("smart TVs"), network-connected media players (e.g., Blu-ray player), a set-top box, over-the-top (OTT) streaming devices, operator boxes, etc. In some embodiments, computer system architecture 100 can receive testing data for a substrate support assembly from client device 120. For example, client device 120 can display a graphical user interface (GUI), where the GUI enables the user to provide, as input, testing data associated with a substrate support assembly. In some embodiments, the GUI of client device 120 can provide an indication of a quality rating for the substrate support assembly, in accordance with embodiments described herein.

Data store 140 can be a memory (e.g., random access memory), a drive (e.g., a hard drive, a flash drive), a database system, or another type of component or device capable of storing data. Data store 140 can include multiple storage components (e.g., multiple drives or multiple databases) that can span multiple computing devices (e.g., multiple server computers). The data store 140 can store data associated with testing a substrate support assembly. For example, data store 140 can store data collected by one or more testing data collection components 128 of testing equipment 122. Testing data can refer to prior testing data (e.g.,) and/or current testing data (e.g., testing data generated for a current substrate support assembly tested at testing equipment 122).

Prior testing data refers to testing data generated for a prior substrate support assembly tested at testing equipment 122 according to a prior or prior testing process. For example, a prior substrate support assembly can be tested according to a prior testing process where a RF power component delivers power to an electrical component (e.g., an electrode, a heater) of the prior substrate support assembly. The RF power component can deliver various amounts of RF power to the component, or can deliver the RF power at various frequencies, in accordance with one or more operations of the prior testing process. A RF power sensor can be coupled to the electrical component and can monitor an amount of power flowed through the electrical component as RF power is delivered to the component. An electron flow sensor can be coupled to an impedance circuit for the prior substrate support assembly and can generate a measurement for the electron flow (i.e. the current) across the impedance circuit during the prior testing process. Data collected by the RF power sensor and the electron flow sensor can be stored at data store 140 as prior testing data. In some embodiments, data associated with the one or more operations of the prior testing process can also be stored at data store 140 as prior testing data. For example, an indication of each amount of RF power and/or a frequency of RF power delivered to the substrate support assembly component by the RF power component can be stored at data store 140 as prior testing data.

Current testing data refers to testing data generated for a current substrate support assembly that is tested according to a current testing process. In some embodiments, the current testing process for the current substrate support assembly can be performed at testing equipment 122. In other or similar embodiments, the current testing process for the current electrical component can be performed at other testing equipment (i.e., testing equipment that is not part of computer system architecture 100). In such embodiments, the testing equipment may not include the same or similar test condition components or testing data collection components as included in testing equipment 122 of computing system 100. For example, the testing equipment can include a testing fixture that includes a RF power component and a RF power sensor, but the testing equipment does not include an electron power sensor. In such example, a testing process can be performed for the electrical component of manufacturing equipment 122 (e.g., a substrate support assembly), as previously described. Data collected by the RF power sensor of the testing fixture can be stored at data store 140 as current testing data. In some embodiment, data associated with the one or more operations of the current testing process can also be stored at data store 140 as current testing data. For example, an indication of each amount of RF power and/or a frequency of RF power delivered to the current substrate support assembly component by the RF power component can be stored at data store 140 as current testing data. As the testing equipment does not include an electron flow sensor, the current testing data stored at data store 140 does not include a measurement value for an electron flow through an impedance circuit of the current substrate support assembly.

The data store 140 can also store contextual data associated with one or more substrate support assemblies that are tested in accordance with embodiment described herein. Contextual data can include an identifier for the substrate support assembly, an identifier for one or more electrical components of the substrate support assembly, an identifier for a recipe for constructing the substrate support assembly, an identifier for a testing process performed for the substrate support assembly, and so forth. Contextual data can refer to prior contextual data (e.g., contextual data associated with a prior testing process performed for a prior substrate support assembly) and/or current contextual data (e.g., contextual data associated with a current testing process performed for a current substrate support assembly).

In some embodiments, data store 140 can be configured to store data that is not accessible to a user of the manufacturing system. For example, testing data, contextual data, etc. for a substrate support assembly is not accessible to a user (e.g., an operator) of the manufacturing system and/or testing system. In some embodiments, all data stored at data store 140 can be inaccessible by the user of the system. In other or similar embodiments, a portion of data stored at data store 140 can be inaccessible by the user while another portion of data stored at data store 140 can be accessible by the user. In some embodiments, one or more portions of data stored at data store 140 can be encrypted using an encryption mechanism that is unknown to the user (e.g., data is encrypted using a private encryption key). In other or similar embodiments, data store 140 can include multiple data stores where data that is inaccessible to the user is stored in one or more first data stores and data that is accessible to the user is stored in one or more second data stores.

In some embodiments, predictive system 110 includes server machine 170 and server machine 180. Server machine 170 includes a training set generator 172 that is capable of generating training data sets (e.g., a set of data inputs and a set of target outputs) to train, validate, and/or test a machine learning model 190. Machine learning model 190 is also referred to as model 190 and/or trained machine learning model 190, as seen below. Some operations of data set generator 172 are described in detail below with respect to FIG. 7. In some embodiments, the data set generator 172 can partition the training data into a training set, a validating set, and a testing set. In some embodiments, the predictive system 110 generates multiple sets of training data.

Server machine 180 can include a training engine 182, a validation engine 184, a selection engine 185, and/or a testing engine 186. An engine can refer to hardware (e.g., circuitry, dedicated logic, programmable logic, microcode, processing device, etc.), software (such as instructions run on a processing device, a general purpose computer system, or a dedicated machine), firmware, microcode, or a combination thereof. Training engine 182 can be capable of training a machine learning model 190. The machine learning model 190 can refer to the model artifact that is created by the training engine 182 using the training data that includes training inputs and corresponding target outputs (correct answers for respective training inputs). The training engine 182 can find patterns in the training data that map the training input to the target output (the answer to be predicted), and provide the machine learning model 190 that captures these patterns. The machine learning model 190 can use one or more of support vector machine (SVM), Radial Basis Function (RBF), clustering, supervised machine learning, semi-supervised machine learning, unsupervised machine learning, k-nearest neighbor algorithm (k-NN), linear regression, random forest, neural network (e.g., artificial neural network), etc.

The validation engine 184 can be capable of validating a trained machine learning model 190 using a corresponding set of features of a validation set from training set generator 172. The validation engine 184 can determine an accuracy of each of the trained machine learning models 190 based on the corresponding sets of features of the validation set. The validation engine 184 can discard a trained machine learning model 190 that has an accuracy that does not meet a threshold accuracy. In some embodiments, the selection engine 185 can be capable of selecting a trained machine learning model 190 that has an accuracy that meets a threshold accuracy. In some embodiments, the selection engine 185 can be capable of selecting the trained machine learning model 190 that has the highest accuracy of the trained machine learning models 190.

The testing engine 186 can be capable of testing a trained machine learning model 190 using a corresponding set of features of a testing set from data set generator 172. For example, a first trained machine learning model 190 that was trained using a first set of features of the training set can be tested using the first set of features of the testing set. The testing engine 186 can determine a trained machine learning model 190 that has the highest accuracy of all of the trained machine learning models based on the testing sets.

Predictive server 112 includes a predictive component 114 that is capable of providing a measurement value for an electron flow across an impedance circuit of a substrate support assembly. As described in detail below with respect to FIG. 4, in some embodiments, predictive component 114 is capable of providing testing data associated with a current testing process performed for a current substrate support assembly as and input to model 190 and obtain one or more outputs from model 190. As described above, the data associated with the current testing process can include data indicating an amount of RF power flowed through an element (e.g., an electrical component) of a substrate support assembly during the current testing process. Predictive server 112 can extract a measurement value for an electron flow across an impedance circuit of the substrate support assembly form the one or more outputs obtained from model 190. In response to determining that the extracted measurement value satisfies an electron flow criterion, predictive server 112 can assign a quality rating to the substrate support assembly that is associated with a high quality component. In response to determining that the extracted measurement value does not satisfy the electron flow criterion, predictive server 112 can assign a quality rating to the substrate support assembly that is associated with a low quality component. Predictive server 112 can store the quality rating of the substrate support assembly at data store 140.

In some embodiments predictive server 112 can assign the quality rating to the substrate support assembly, as described above. In other embodiments, a component other than predictive server 112 can assign the quality rating to the substrate support assembly, based on the measurement value extracted from the output of model 190. For example, predictive server 112 can extract the measurement value from the output of model 190, in accordance with previously described embodiments, and can store the extracted measurement value at data store 140. Another component of computer system architecture 100 (e.g., manufacturing equipment 124, testing equipment 122, client device 120) can assign the quality rating to the substrate support assembly and store the assigned quality rating at data store 140, as previously described.

In some embodiments, predictive server 112 (or manufacturing equipment 124 or testing equipment 122) can transmit an indication of the assigned quality rating to client device 120. Client device 120 can provide the indication of the assigned quality rating to a user of the manufacturing system and/or testing system (e.g., an operator) via the GUI of client device 120.

The client device 120, manufacturing equipment 124, testing equipment 122, predictive server 112, data store 140, server machine 170, and server machine 180 can be coupled to each other via a network 130. In some embodiments, network 130 is a public network that provides client device 120 with access to predictive server 112, data store 140, and other publically available computing devices. In some embodiments, network 130 is a private network that provides client device 120 access to manufacturing equipment 124, testing equipment 122, data store 140, and other privately available computing devices. Network 130 can include one or more wide area networks (WANs), local area networks (LANs), wired networks (e.g., Ethernet network), wireless networks (e.g., an 802.11 network or a Wi-Fi network), cellular networks (e.g., a Long Term Evolution (LTE) network), routers, hubs, switches, server computers, cloud computing networks, and/or a combination thereof.

It should be noted that in some other implementations, the functions of server machine 170 and server machine 180, as well as predictive server 112, can be provided by a fewer number of machines. For example, in some embodiments, server machine server machine 170 and server machine 180 can be integrated into a single machine, while in some other or similar embodiments, server machine server machine 170 and server machine 180, as well as predictive server 112, can be integrated into a single machine.

In general, functions described in one implementation as being performed by server machine 170, server machine 180, and/or predictive server 112 can also be performed on client device 120. In addition, the functionality attributed to a particular component can be performed by different or multiple components operating together.

In embodiments, a "user" can be represented as a single individual. However, other embodiments of the disclosure encompass a "user" being an entity controlled by a plurality of users and/or an automated source. For example, a set of individual users federated as a group of administrators can be considered a "user."

Figure 2:
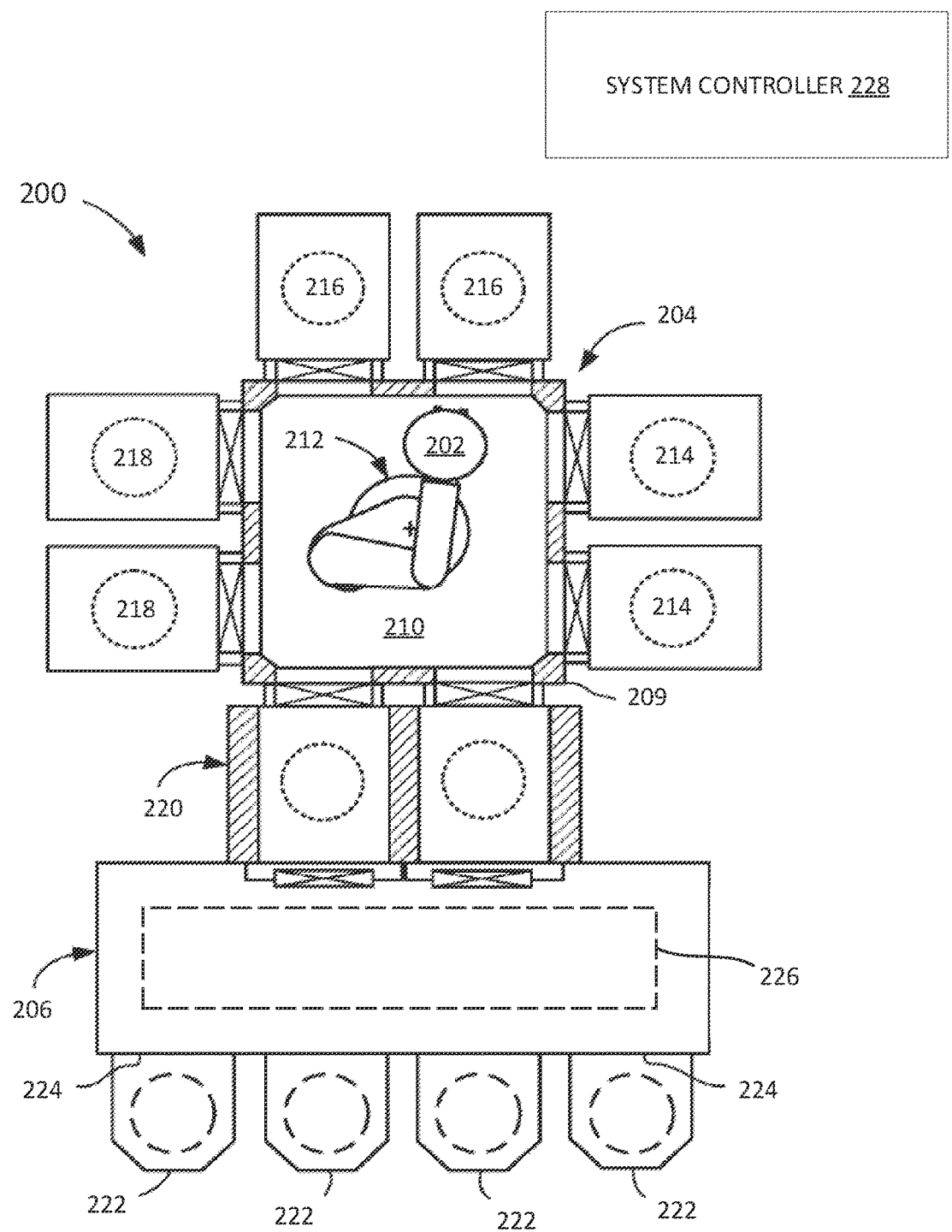
FIG. 2 is a top schematic view of an example manufacturing system, according to aspects of the present disclosure.

FIG. 2 is a top schematic view of an example manufacturing system 200, according to aspects of the present disclosure. Manufacturing system 200 can perform one or more processes on a substrate 202. Substrate 202 can be any suitably rigid, fixed-dimension, planar article, such as, e.g., a silicon-containing disc or wafer, a patterned wafer, a glass plate, or the like, suitable for fabricating electronic devices or circuit components thereon.

Manufacturing system 200 can include a process tool 204 and a factory interface 206 coupled to process tool 204. Process tool 204 can include a housing 208 having a transfer chamber 210 therein. Transfer chamber 210 can include one or more process chambers (also referred to as processing chambers) 214, 216, 218 disposed therearound and coupled thereto. Process chambers 214, 216, 18 can be coupled to transfer chamber 210 through respective ports. Transfer chamber 210 can also include a transfer chamber robot 212 configured to transfer substrate 202 between process chambers 214, 216, 218, load lock 220, etc.

Process chambers 214, 216, 218 can be adapted to carry out any number of processes on substrates 202. A same or different substrate process can take place in each processing chamber 214, 216, 218. A substrate process can include atomic layer deposition (ALD), physical vapor deposition (PVD), chemical vapor deposition (CVD), etching, annealing, curing, pre-cleaning, metal or metal oxide removal, or the like. Other processes can be carried out on substrates therein.

A load lock 220 can also be coupled to housing 208 and transfer chamber 210. Load lock 220 can be configured to interface with, and be coupled to, transfer chamber 210 on one side and factory interface 206. Factory interface 206 can be any suitable enclosure, such as, e.g., an Equipment Front End Module (EFEM). Factory interface 206 can be configured to receive substrates 202 from substrate carriers 222

(e.g., Front Opening Unified Pods (FOUPs)) docked at various load ports 224 of factory interface 206. A factory interface robot 226 (shown dotted) can be configured to transfer substrates 202 between carriers (also referred to as containers) 222 and load lock 220.

Manufacturing system 200 can also include a system controller 228. System controller 228 can be and/or include a computing device such as a personal computer, a server computer, a programmable logic controller (PLC), a microcontroller, and so on. System controller 228 can include one or more processing devices, which can be general-purpose processing devices such as a microprocessor, central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device can also be one or more special-purpose processing devices such as an application specific integrated circuit (ASIC), a field programmable gate array (FPGA), a digital signal processor (DSP), network processor, or the like. System controller 228 can include a data storage device (e.g., one or more disk drives and/or solid state drives), a main memory, a static memory, a network interface, and/or other components. System controller 228 can execute instructions to perform any one or more of the methodologies and/or embodiments described herein. In some embodiments, system controller 228 can execute instructions to perform one or more operations at manufacturing system 200 in accordance with a process recipe. The instructions can be stored on a computer readable storage medium, which can include the main memory, static memory, secondary storage and/or processing device (during execution of the instructions).

Figure 3:
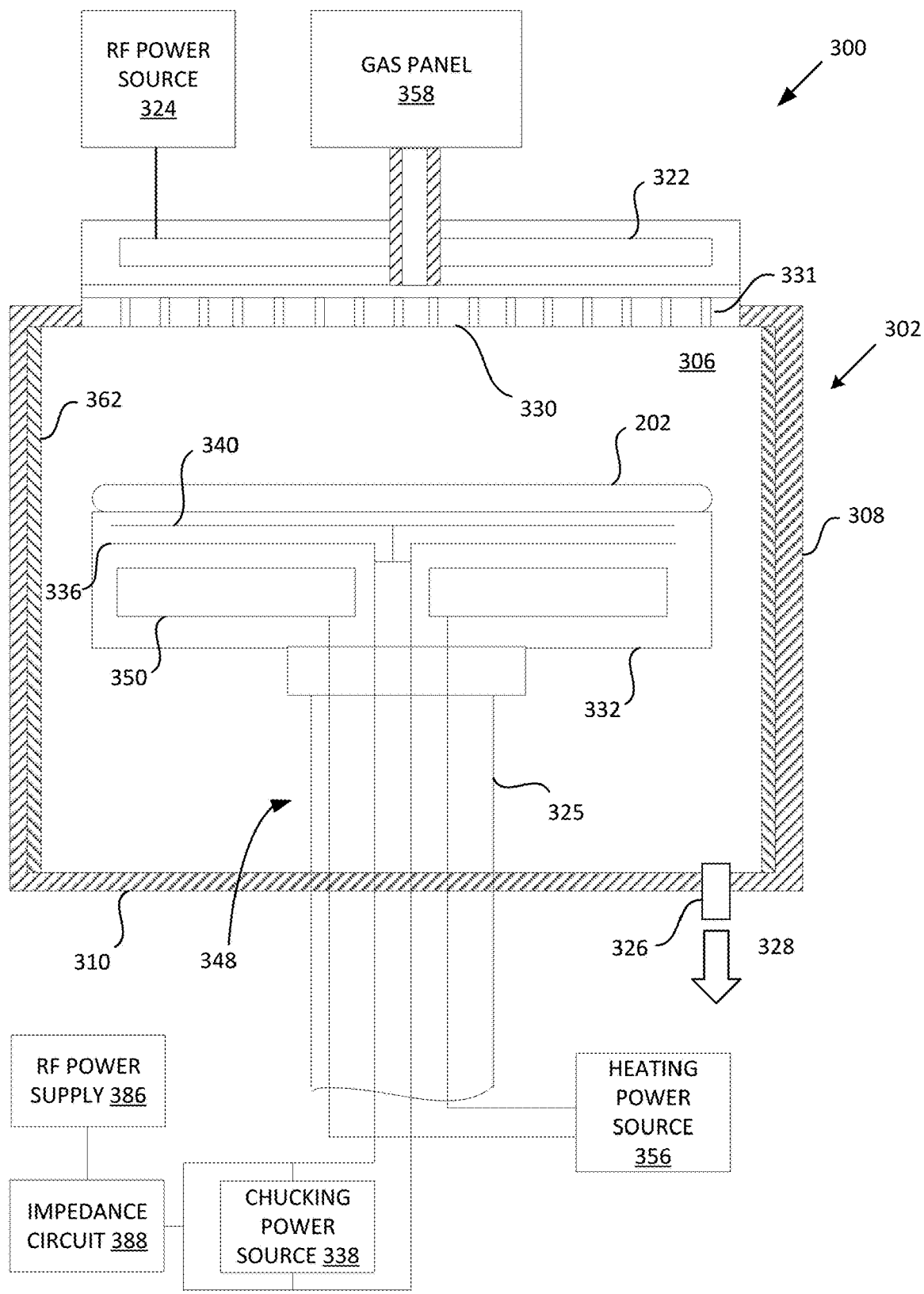
FIG. 3 is a cross-sectional schematic side view of an example process chamber of the example manufacturing system, according to aspects of the present disclosure.

FIG. 3 is a cross-sectional schematic side view of an example process chamber 300 of the example manufacturing system 200, according to aspects of the present disclosure. In some embodiments, process chamber 300 can correspond to process chamber 214, 216, 218 described with respect to FIG. 2. Process chamber 300 can be used for processes in which a corrosive plasma environment is provided. For example, the process chamber 300 can be a chamber for a plasma etcher or plasma etch reactor, and so forth. In another example, process chamber can be a chamber for a deposition process, as previously described. In one embodiment, the process chamber 300 includes a chamber body 302 and a showerhead 330 that encloses an interior volume 306. The showerhead 330 can include a showerhead base and a showerhead gas distribution plate. Alternatively, the showerhead 330 can be replaced by a lid and a nozzle in some embodiments, or by multiple pie shaped showerhead compartments and plasma generation units in other embodiments. The chamber body 302 can be fabricated from aluminum, stainless steel or other suitable material such as titanium (Ti). The chamber body 302 generally includes sidewalls 308 and a bottom 310. An exhaust port 326 can be defined in the chamber body 302, and can couple the interior volume 306 to a pump system 328. The pump system 328 can include one or more pumps and throttle valves utilized to evacuate and regulate the pressure of the interior volume 306 of the process chamber 300.

The showerhead 330 can be supported on the sidewall 308 of the chamber body 302. The showerhead 330 (or lid) can be opened to allow access to the interior volume 306 of the process chamber 300, and can provide a seal for the process chamber 300 while closed. A gas panel 358 can be coupled to the process chamber 300 to provide process and/or cleaning gases to the interior volume 306 through the showerhead 330 or lid and nozzle (e.g., through apertures of the showerhead or lid and nozzle). The showerhead 330 can include a gas distribution plate (GDP) and can have multiple gas delivery holes 331 (also referred to as channels) throughout the GDP. A substrate support assembly 348 is disposed in the interior volume 306 of the process chamber 300 below the showerhead 330. The substrate support assembly 348 holds a substrate 202 during processing.

As described above, process chamber 300 can be used to perform a process in which plasma is generated (e.g., an etch process, a deposition process, etc.). Process chamber can include an electrode 322 that is configured to generate and/or maintain a plasma from gases provided by gas panel 358. Electrode 322 can be coupled to a RF power source 324 that is configured to provide an RF power signal to electrode 322. Electrode 322 can transmit the RF power signal from RF power source 324 to the interior volume 306 of process chamber 300 and generate a capacitively-coupled plasma therein. In some embodiments, electrode 322 can transmit the RF power signal to other components of process chamber 300, such as substrate support assembly 348 and elements included in substrate support assembly 348. As illustrated in FIG. 3, electrode 322 can be coupled to an exterior portion of process chamber 300 (e.g., embedded in a lid, etc.), in some embodiments. It should be noted that, in other or similar embodiments, electrode 322 can be included at any portion of process chamber 300 (e.g., embedded in the interior volume 306 of process chamber 300, etc.).

The substrate support assembly 348 generally includes at least a substrate support 332. The substrate support 332 may be a vacuum chuck, an electrostatic chuck, a susceptor, or other workpiece support surface. In some embodiments, the substrate support 332 can be an electrostatic chuck (referred to as electrostatic chuck 332 herein). The substrate support assembly 348 can additionally include heating elements 350 (e.g., in a heater assembly). The substrate support assembly 348 may also include a cooling base. The cooling base may alternately be separate from the substrate support assembly 348. The substrate support assembly 348 may be removably coupled to a support pedestal 325. The support pedestal 325, which may include a pedestal base and a facility plate, is mounted to the chamber body 302. The facility plate can be configured to accommodate electrical connections from the electrostatic chuck 332 and the heating elements 350. The electrical connections from electrostatic chuck 332 and/or heating elements 350 can run externally or internally of substrate support assembly 348.

Electrostatic chuck 332 has a mounting surface and a workpiece surface opposite the mounting surface. The electrostatic chuck 332 generally includes a chucking electrode 336 embedded in a dielectric body. The chucking electrode 336 can be configured as a mono polar or bipolar electrode, or other suitable arrangement. The chucking electrode 336 can be coupled through an RF filter to a chucking power source 338 which provides a radio frequency (RF) or direct current (DC) power to electrostatically secure the substrate 202 to the upper surface of the dielectric body. The RF filter prevents RF power utilized to form a plasma within the processing chamber 300 from damaging electrical equipment or presenting an electrical hazard outside the chamber.

In some embodiments, another electrode 340 can be embedded in substrate support assembly 348. RF power can be provided to electrode 340 via an RF power supply 386. RF power supply 386 can be coupled to electrode 340 via an impedance circuit 388. Impedance circuit 388 can be configured to maintain a particular amount of RF power transmitted to an element of substrate support assembly 348 (e.g., chucking electrode 336, heating elements 350, etc.). In some embodiments, impedance circuit 388 can be a component of an auto capacitance tuner. RF power supply 386 can include one or more frequency generators configured to generate RF power at a particular frequency. In some embodiments, RF power supply 386 can include two or more frequency generators each configured to generate RF power at different frequencies (i.e., separately or simultaneously).

In some embodiments, impedance circuit 388 can enable the striking and sustaining of plasma in the interior volume 306 of process chamber 300. In some embodiments, impedance circuit 388 can combine the RF power signals of various frequencies from RF power supply 386 and can transmit the combined RF power signal to electrode 340. Electrode 340 can transmit the combined RF power signal to the process gas in interior volume 106 to generate and/or maintain a capacitively-coupled plasma therein. In some embodiments, electrode 322 and electrode 340 can both be configured to generate and maintain plasma in the interior volume 306. In other or similar embodiments, electrode 340 can be configured to generate and maintain plasma in the interior volume 306 without electrode 322. Chamber body 402 can be coupled to ground (not shown) and can provide an RF return path for facilitating generation of the plasma.

As described above, substrate support assembly 348 can include a heater assembly that includes heating elements 350. Heating elements 350 can include one or more main resistive heating elements and/or multiple auxiliary heating elements embedded in a body (e.g., of the electrostatic chuck). The main resistive heating elements can be configured to elevate the temperature of the substrate support assembly 348 and the supported substrate 202 to a temperature specified in a process recipe. The auxiliary heating elements can be configured to provide localized adjustments to the temperature profile of the substrate support assembly 348 generated by the main resistive heating elements. Thus, the main resistive heating elements operate on a globalized macro scale while the auxiliary heating elements operate on a localized micro scale. In some embodiments, heating elements 350 can be coupled to a switching module (not shown) that includes one or more switching devices. The switching module can be coupled through an RF filter to a heater power source 356. The switching devices in the switching module switch on and off the flow of power to the heating elements 350 based on signals received from a controller (e.g., system controller 228 of FIG. 2). The power source 356 can provide up to 900 watts or more power to heating elements 350.

Figure 4:
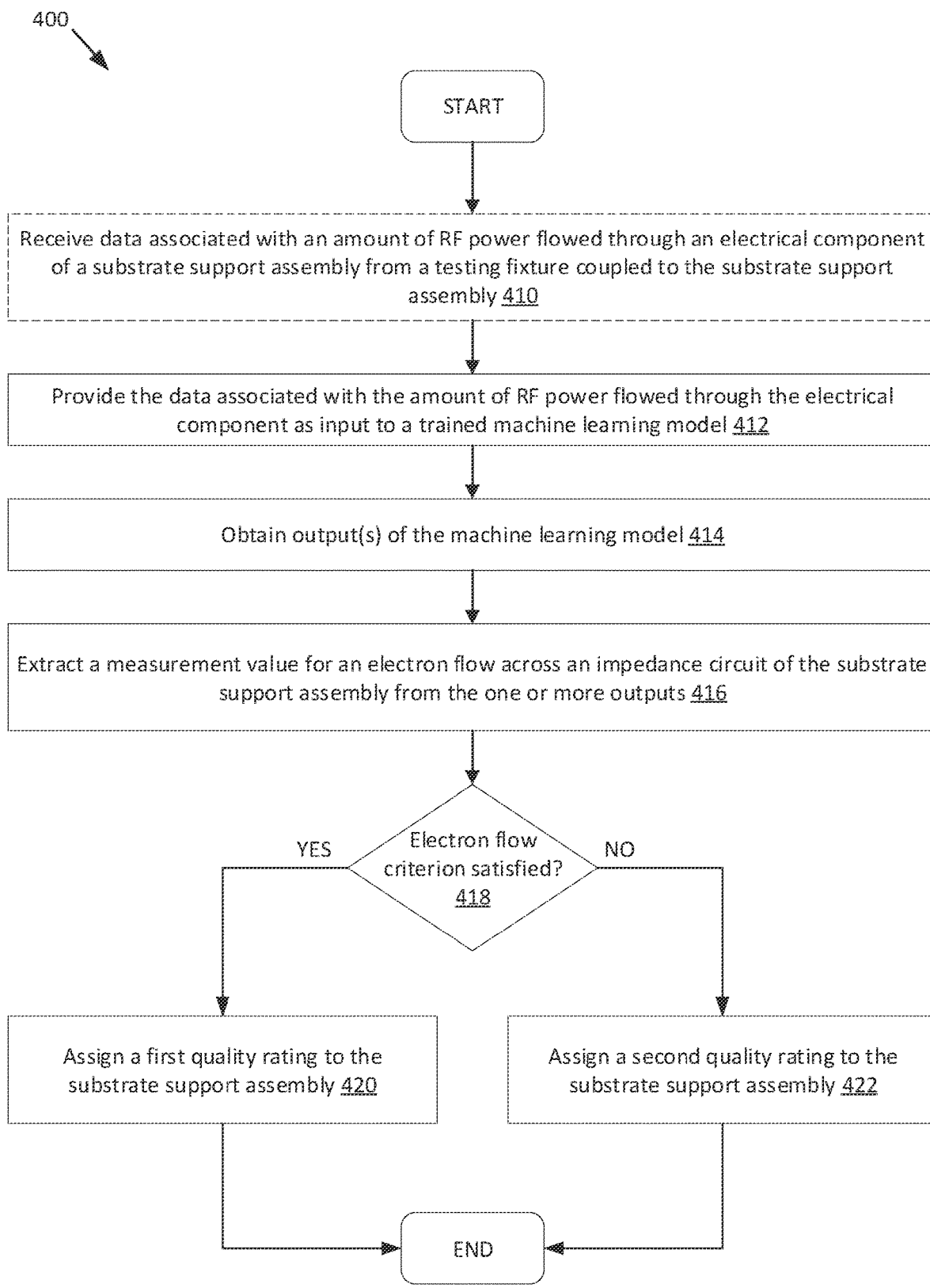
FIG. 4 is a flow chart of a method for rating a substrate support assembly based on impedance circuit electron flow, according to aspects of the present disclosure.

FIG. 4 is a flow chart of a method for rating a substrate support assembly based on impedance circuit electron flow, according to aspects of the present disclosure. Method 400 is performed by processing logic that can include hardware (circuitry, dedicated logic, etc.), software (such as is run on a general purpose computer system or a dedicated machine), firmware, or some combination thereof. In one implementation, method 400 can be performed by a computer system, such as computer system architecture 100 of FIG. 1. In other or similar implementations, one or more operations of method 400 can be performed by one or more other machines not depicted in the figures. In some aspects, one or more operations of method 400 can be performed by predictive component 114 of predictive server 112.

For simplicity of explanation, the methods are depicted and described as a series of acts. However, acts in accordance with this disclosure can occur in various orders and/or concurrently, and with other acts not presented and described herein. Furthermore, not all illustrated acts can be performed to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term article of manufacture, as used herein, is intended to encompass a computer program accessible from any computer-readable device or storage media.

At block 410, processing logic can optionally receive data associated with an amount of RF power flowed through an electrical component of a substrate support assembly from a testing fixture coupled to the substrate support assembly. In some embodiments, the testing fixture can be testing fixture 500 of FIG. 5. Testing fixture 500 can be configured to simulate the flow of RF power through electrical components (e.g., electrode 340, electrode 336, heating elements 350, etc.) of a substrate support assembly during a process performed at a process chamber (e.g., process chamber 300). In some embodiments, testing fixture 500 can include a RF power test component 510, one or more RF power input components 512, and a RF power output component 514.

RF power test component 510 can include a memory component configured to store one or more operations for a testing process to be performed for substrate support assembly 348 and a processing device configured to execute the one or more operations for the testing process. In some embodiments, RF power test component 510 can be or include components of a network analyzer device. RF power input component 512 can be configured to simulate one or more electrodes that flow RF power through process chamber 300, as described above. For example, RF power input component 512 can include a RF power source and an electrode that is configured to simulate RF power source 324 and electrode 322 of FIG. 3, respectively. In some embodiments, RF power input component 512 can engage with a workpiece surface of electrostatic chuck 332 included in substrate support assembly 348 and can be configured to flow RF power through the electrical components (e.g., electrodes, heating elements, etc.) of substrate support assembly 348 in a similar fashion as provided by electrode 322.

RF power output component 514 can include one or more sensors configured to collect data associated with RF power flowed through the electrical components of substrate support assembly 348. For example, RF power output component 514 can include one or more sensors configured to detect an amount of RF power that is transmitted through each electrical component. In some embodiments, RF power output component 514 can be coupled directly to a respective electrical component that RF power output component 514 is configured to monitor. In other or similar embodiments, RF power output component 514 can be coupled to an electrical connection that is coupled to a respective electrical component.

As described previously, RF power input component 512 can flow RF power through the electrical components of substrate support assembly 348 in accordance with one or more operations of a testing process. As RF power input component 512 flows RF power through the electrical components, RF power output component 514 can collect data associated with the transmitted RF power and can transmit the collected data to RF power test component 510.

RF power test component 510 can receive the collected data from RF power output test component 514 and can generate testing data based on the collected data. In some embodiments, RF power test component 510 can generate one or more scattering parameter values (i.e., a parameter value corresponding to an amount of RF power loss) associated with a respective electrical component.

In some embodiments, the operations of the testing process for substrate support assembly 348 can include instructions to collect RF power testing data for the electrical components of substrate support assembly 348 for multiple different frequencies. RF power test component 510 can transmit instructions to RF power input component 512 to cause RF power to be flowed through the electrical components at each different frequency and can receive data collected by RF power output component 514 for each different frequency. A module of RF power test component 510 (e.g., a network analyzer) can generate scattering parameter values based on the received data, as previously described, and can generate a mapping between the scattering parameter values and an indication of the frequency applied to the electrical component when the RF power data associated with the scattering parameter values was collected. RF power test component 514 can store the generated mapping at the memory component of RF power test component and, in some embodiments, RF power test component 514 can transmit the generated mapping to another component (i.e., of testing equipment 122).

Referring back to FIG. 4, in some embodiments, processing logic may not receive data associated with the amount of RF power flowed through the electrical component of the substrate support assembly form the testing fixture and instead may receive the data from another component. For example, in some embodiments, testing data can be generated using components that are not included in computer system architecture 100 of FIG. 1. In such example, a user of a manufacturing system and/or a testing system can provide the testing data (e.g., scattering parameter values) to computer architecture 100 via a client device (e.g., client device 120) of computer architecture 100, in accordance with previously described embodiments.

At block 412, processing logic can provide the data associated with the amount of RF power flowed through the electrical component as input to a trained machine learning model. As described with respect to FIG. 5, the data associated with the amount of RF power flowed through the electrical component can include the one or more scattering parameter values generated by RF power test component 510 (e.g., by a network analyzer of RF power test component 510). In some embodiments, the data provided as input to the trained machine learning model can include the mapping between the scattering parameter values and the associated frequency, as previously described.

In some embodiments, the trained machine learning model can be model 190 described with respect to FIG. 1. Model 190 can be trained with an input-output mapping including an input and output. The input can be based on prior data associated with a prior amount of RF power flowed through a prior electrical component of a prior substrate support assembly during a prior testing process performed for the prior substrate support assembly. In some embodiments, the prior amount of RF power flowed through the prior electrical component can be detected by testing fixture 500 or a testing fixture similar to testing fixture 500. The output can include an identification of a prior measurement value for an electron flow across a impedance circuit of the prior substrate support assembly as the RF power is flowed through the prior electrical component. In some embodiments, the prior measurement value can be generated by circuit test component 516 or a circuit test component similar to circuit test component 516. Further details about circuit test component 516 are provided below.

At block 414, processing logic can obtain one or more outputs of the trained machine learning model. In some embodiments, the one or more outputs can include a measurement value for a prior electron flow across a prior impedance circuit of a prior substrate support assembly during a prior testing process performed for the prior substrate support assembly. The one or more outputs can also include a level of confidence that the substrate support assembly being tested according to the current testing process at the manufacturing system is associated with the measurement value for the prior electron flow across the prior impedance circuit of the prior substrate support assembly.

At block 416, the processing logic extracts the measurement value for the electron flow across the impedance circuit of the substrate support assembly from the one or more outputs. In some embodiments, the processing logic can extract the measurement value from the outputs of the trained machine learning model by determining that a level of confidence associated with a particular measurement value satisfies a confidence criterion. For example, the processing logic can determine that a particular measurement value is associated with a level of confidence that exceeds a threshold level of confidence and/or larger than a level of confidence associated with other measurement values of the one or more outputs.

At block 418, processing logic can determine whether the extracted measurement value for the electron flow satisfies an electron flow criterion. In some embodiments, the extracted measurement value for the electron flow can satisfy the electron flow criterion if the extracted measurement value exceeds a threshold measurement value. In response to processing logic determining that the extracted measurement value satisfies the electron flow criterion, method 400 can continue to block 420. In response to processing logic determining that the extracted measurement value does not satisfy the electron flow criterion, method 400 can continue to block 422.

At block 420, processing logic can assign a first quality rating to the substrate support assembly responsive to a determination that the extracted measurement value satisfies the electron flow criterion. At block 422, processing logic can assign a second quality rating to the substrate support assembly responsive to a determination that the extracted measurement value satisfies the electron flow criterion. In some embodiments, the first quality rating can correspond to a higher quality substrate support assembly than a respective substrate support assembly associated with the second quality rating.

In some embodiments, processing logic can transmit an indication of the assigned first quality rating or the assigned second quality rating to a client device coupled to the testing system. The client device can be client device 120 of FIG. 1, in some embodiments. In response to receiving the quality rating assigned to the substrate support assembly, the client device can provide an indication of the quality rating to a user (e.g., an operator) of the testing system via a GUI of the client device.

Figure 6:
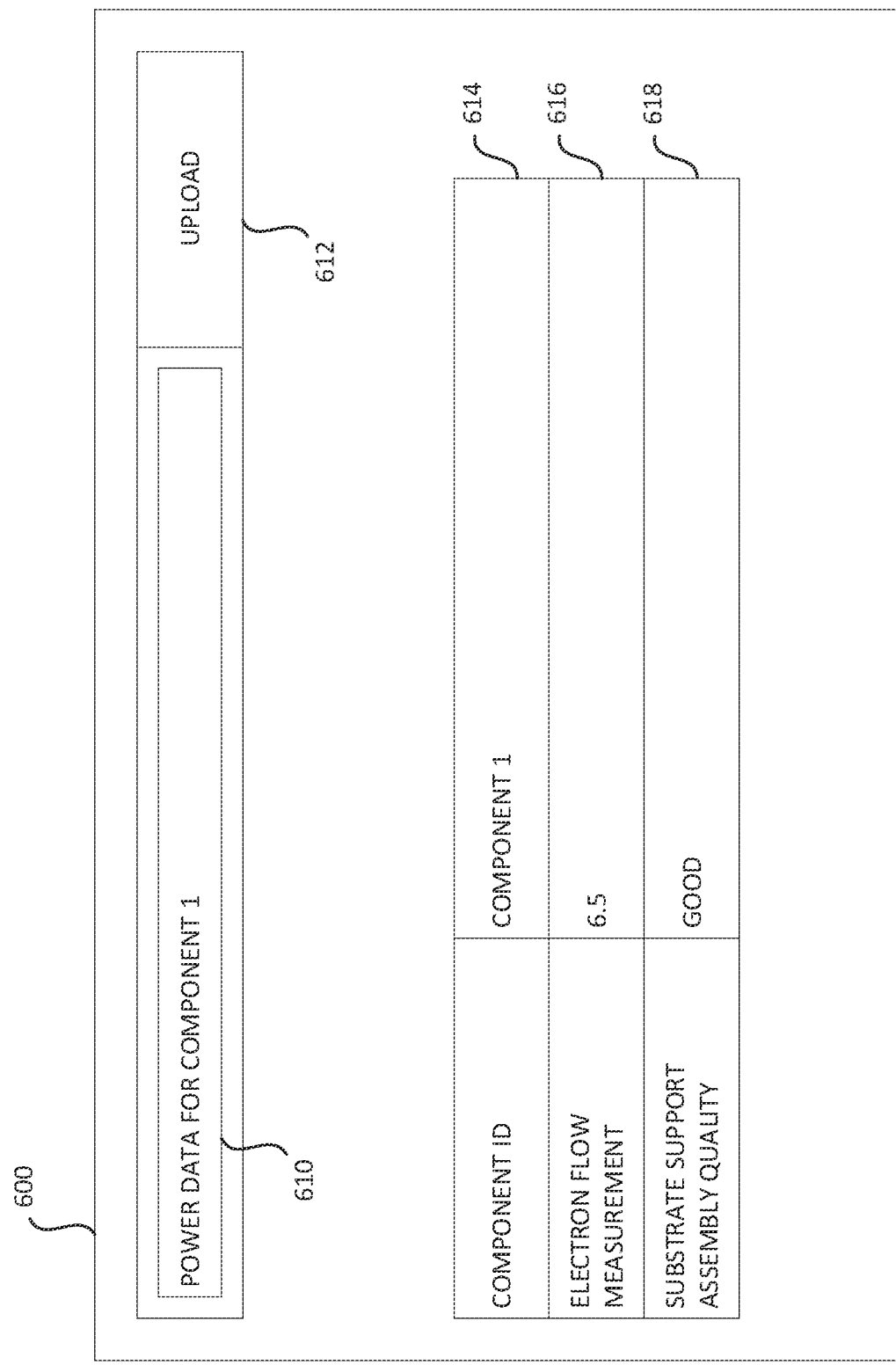
FIG. 6 illustrates an example graphical user interface (GUI) for rating a substrate support assembly based on impedance circuit electron flow, according to aspects of the present disclosure.

FIG. 6 illustrates an example GUI 600 provided by a client device (e.g., client device 120) coupled to the testing system. GUI 600 includes a first portion configured to enable a user to provide power data for an electrical component of substrate support assembly 348 to the testing system. As illustrated in FIG. 6, the first portion of GUI 600 includes a field 610 that enables a user to provide a name of a file that includes the power data for an electrical component. In some embodiments, the file can include one or more scattering parameter values generated for the electrical component at various frequencies as RF power was flowed through the electrical component. The first portion of GUI 600 further includes an element 612 that enables the user to upload the file to the testing system. In some embodiments, in response to a user engaging with element 612, the file including the power data for the electrical component is transmitted to predictive server 112. One or more components of the testing system (e.g., predictive server 112) can provide the power data for the electrical component included in the file as an input to the trained machine learning model and can assign a quality rating to the substrate support assembly, in accordance with previously described embodiments. In some embodiments, the one or more components of the testing system does not assign the quality rating to the substrate support assembly and instead obtains the measurement for the electron flow through the impedance circuit of the substrate support assembly, as previously described.

In response to the one or more components of the testing system assigning a quality rating to the substrate support assembly, the one or more components can transmit the assigned quality rating and/or an indication of the electron flow measurement to the client device. In some embodiments, the client device receives the indication of the electron flow measurement and determines the quality rating based on the received indication. For example, the client device can determine that a first quality rating is to be assigned to the substrate support assembly in response to determining that the electron flow measurement exceeds a threshold measurement value.

The client device can update GUI 600 to provide information associated with the quality rating of the substrate support assembly. For example, GUI 600 can include a second portion that includes a field 614 that provides an identifier of the electrical component (e.g., "component 1"). GUI 600 can further include a field 616 that provides an indication of the electron flow measurement that was extracted from the one or more outputs of the trained machine learning model. In some embodiments, GUI 600 can further include a field 618 that provides an indication of a quality rating for the substrate support assembly based on the extracted electron flow measurement. In some embodiments, GUI 600 can include both fields 616 and 618. In other or similar embodiments, GUI 600 can include field 616 or field 618.

Referring back to FIG. 4, in some embodiments, processing logic can store the assigned quality rating for the substrate support assembly at a data store of the testing system (e.g., data store 140). In some embodiments, one or more components of computer architecture 100 can determine whether to include the respective substrate support assembly as part of manufacturing equipment 124 for a manufacturing system (e.g., manufacturing system 200) based on the assigned quality rating for the substrate support assembly. For example, a component of computer architecture 100 (e.g., a processing device of testing equipment 122, manufacturing equipment 124, etc.) can determine that a particular substrate support assembly assigned to a second quality rating is not to be installed at a process chamber for manufacturing system 200. In another example, a component of computer system architecture 100 can determine that a substrate support assembly assigned to a first quality rating is to be installed at a process chamber for processes with strict process constraints and a substrate support assembly assigned to a second quality rating is to be installed at a process chamber for processes with less strict process constraints.

Figure 7:
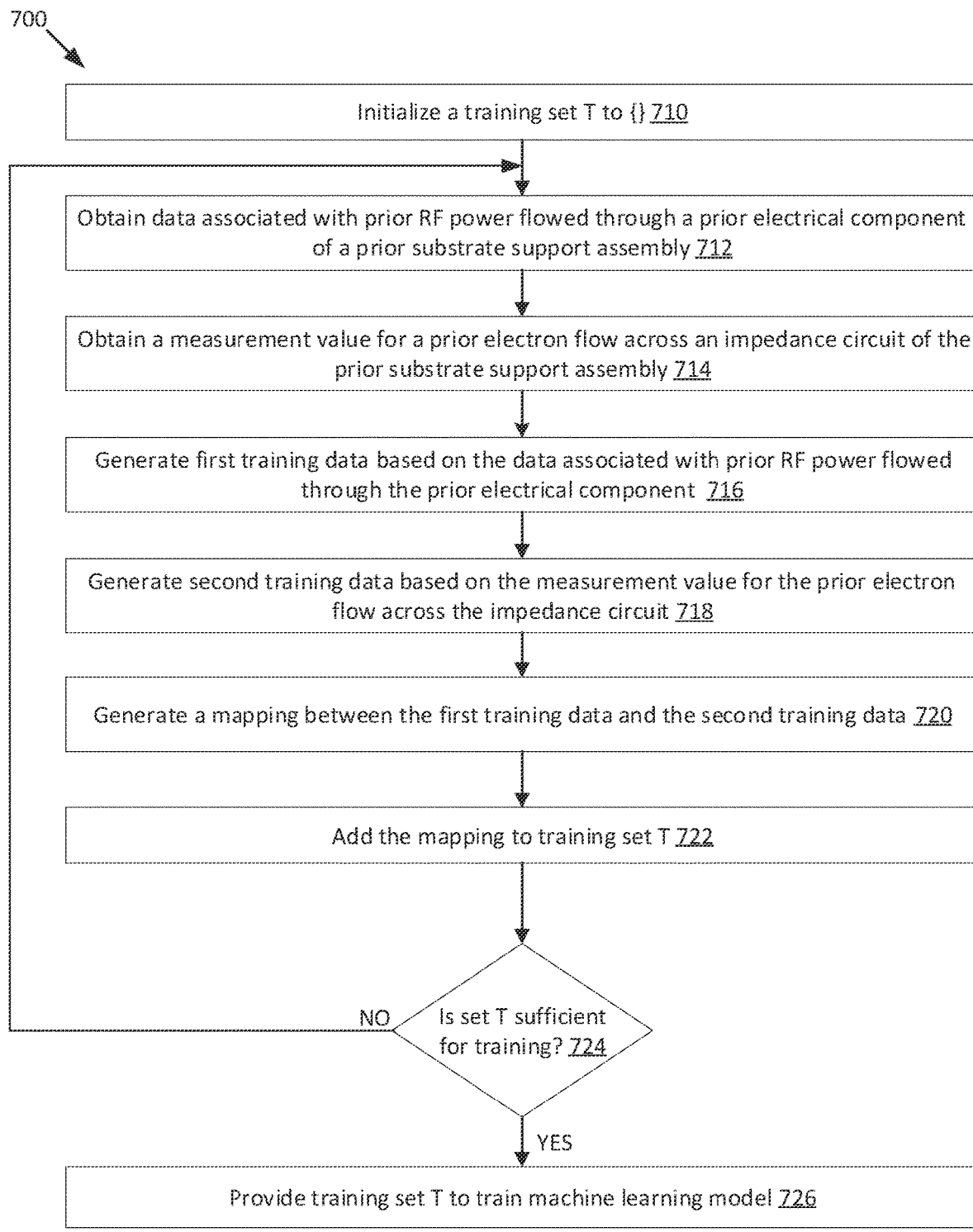
FIG. 7 is a flow chart of a method for training a machine learning model, according to aspects of the present disclosure.

FIG. 7 is a flow chart of a method 700 for training a machine learning model, according to aspects of the present disclosure. Method 700 is performed by processing logic that can include hardware (circuitry, dedicated logic, etc.), software (such as is run on a general purpose computer system or a dedicated machine), firmware, or some combination thereof. In one implementation, method 700 can be performed by a computer system, such as computer system architecture 100 of FIG. 1. In other or similar implementations, one or more operations of method 700 can be performed by one or more other machines not depicted in the figures. In some aspects, one or more operations of method 700 can be performed by training set generator 172 of server machine 170.

For simplicity of explanation, the methods are depicted and described as a series of acts. However, acts in accordance with this disclosure can occur in various orders and/or concurrently, and with other acts not presented and described herein. Furthermore, not all illustrated acts can be performed to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term article of manufacture, as used herein, is intended to encompass a computer program accessible from any computer-readable device or storage media.

At block 710, processing logic initializes a training set T to an empty set (e.g., 0). At block 712, processing logic obtains data associated with prior RF power flowed through a prior electrical component of a prior substrate support assembly. In some embodiments, processing logic can obtain data associated with the prior RF power using a testing fixture, such as testing fixture 500 of FIG. 5. Processing logic can obtain the data associated with prior RF power through other techniques, in other or similar embodiments.

At block 714, processing logic obtains a measurement value for a prior electron flow across an impedance circuit of the prior substrate support assembly. In some embodiments, processing logic can obtain the measurement value from testing equipment coupled to the prior substrate support assembly during performance of the prior testing process. For example, a prior testing process can be performed for a prior substrate support assembly, as previously described. During the prior testing process, a testing fixture (e.g., testing fixture 500) generate testing data associated with the prior RF power flowed through the electrical components of the prior substrate support assembly. A circuit test component (e.g., circuit test component 516 of FIG. 5) can be coupled to an impedance circuit 388 during the prior testing process. Circuit test component 516 can be configured to collect data associated with an electron flow across the impedance circuit during the prior testing process. In some embodiments, circuit test component 516 can be configured to generate a measurement for a current across the impedance circuit of the substrate support assembly. Circuit testing component 516 can collect the data associated with the electron flow and can transmit the collected data to a processing device of computer architecture 100. The processing device (e.g., of testing equipment 122), can store the generated measurement at a data store (e.g., data store 140).

At block 716, processing logic generates first training data based on the data associated with the prior RF power flowed through the prior electrical component. At block 718, processing logic generates second training data based on the measurement value for the prior electron flow across the impedance circuit. At block 720, processing logic generates a mapping between the first training data and the second training data. The mapping refers to the first training data that includes or is based on the data associated with the prior RF power flowed through the prior electrical component and the second training data that includes or is based on the measurement value for the prior electron flow across the impedance circuit, where the first training data is associated with (or mapped to) the second training data. At block 722, processing logic adds the mapping to training set T.

At block 724, processing logic determines whether the training set, T, includes a sufficient amount of training data to train a machine learning model. It should be noted that in some implementations, the sufficiency of training set T can be determined based simply on the number of mappings in the training set, while in some other implementations, the sufficiency of training set T can be determined based on one or more other criteria (e.g., a measure of diversity of the training examples, etc.) in addition to, or instead of, the number of input/output mappings. Responsive to determining the training set does not include a sufficient amount of training data to train the machine learning model, method 700 returns to block 712. Responsive to determining the training set, T, includes a sufficient amount of training data to train the machine learning model, method 700 continues to block 726.

At block 726, processing logic provides training set T to train the machine learning model. In one implementation, the training set T is provided to training engine 182 of server machine 180 to perform the training. In the case of a neural network, for example, input values of a given input/output mapping are input to the neural network, and output values of the input/output mapping are stored in the output nodes of the neural network. The connection weights in the neural network are then adjusted in accordance with a learning algorithm (e.g., backpropagation, etc.), and the procedure is repeated for the other input/output mappings in the training set T. After block 726, machine learning model 190 can be used to predict a measurement value for an electron flow across an impedance circuit of a substrate support assembly, in accordance with embodiments described above.

Figure 8:
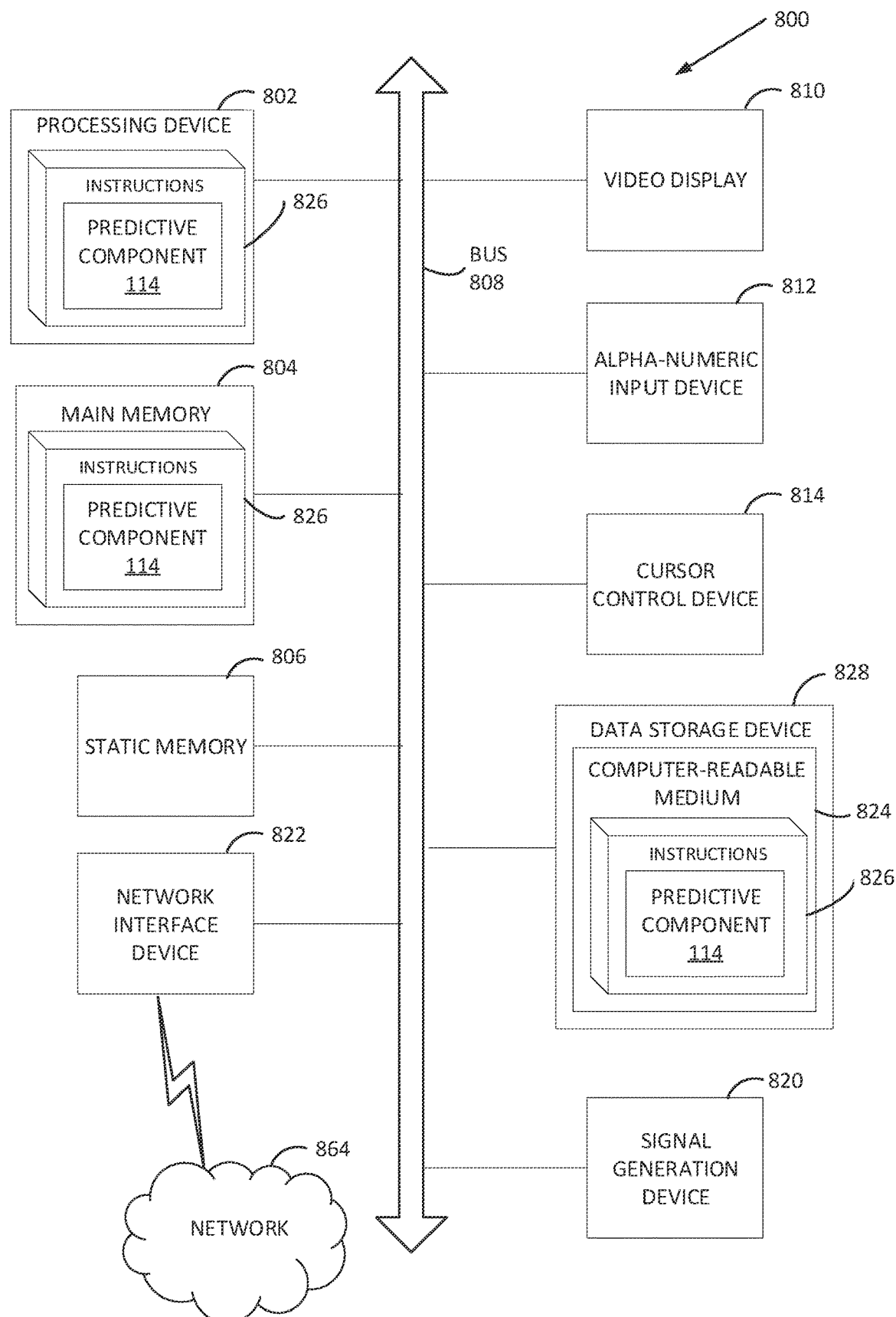
FIG. 8 depicts a block diagram of an illustrative computer system operating in accordance with one or more aspects of the present disclosure.

FIG. 8 depicts a block diagram of an illustrative computer system operating in accordance with one or more aspects of the present disclosure. In alternative embodiments, the machine can be connected (e.g., networked) to other machines in a Local Area Network (LAN), an intranet, an extranet, or the Internet. The machine can operate in the capacity of a server or a client machine in a client-server network environment, or as a peer machine in a peer-to-peer (or distributed) network environment. The machine can be a personal computer (PC), a tablet computer, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. In embodiments, computing device 800 can correspond to predictive server 112 of FIG. 1 or another processing device of system 100.

The example computing device 800 includes a processing device 802, a main memory 804 (e.g., read-only memory (ROM), flash memory, dynamic random access memory (DRAM) such as synchronous DRAM (SDRAM), etc.), a static memory 806 (e.g., flash memory, static random access memory (SRAM), etc.), and a secondary memory (e.g., a data storage device 828), which communicate with each other via a bus 808.

Processing device 802 can represent one or more general-purpose processors such as a microprocessor, central processing unit, or the like. More particularly, the processing device 802 can be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. Processing device 802 can also be or include a system on a chip (SoC), programmable logic controller (PLC), or other type of processing device. Processing device 802 is configured to execute the processing logic for performing operations and steps discussed herein.

The computing device 800 can further include a network interface device 822 for communicating with a network 864. The computing device 800 also can include a video display unit 810 (e.g., a liquid crystal display (LCD) or a cathode ray tube (CRT)), an alphanumeric input device 812 (e.g., a keyboard), a cursor control device 814 (e.g., a mouse), and a signal generation device 820 (e.g., a speaker).

The data storage device 828 can include a machine-readable storage medium (or more specifically a non-transitory computer-readable storage medium) 824 on which is stored one or more sets of instructions 826 embodying any one or more of the methodologies or functions described herein. Wherein a non-transitory storage medium refers to a storage medium other than a carrier wave. The instructions 826 can also reside, completely or at least partially, within the main memory 804 and/or within the processing device 802 during execution thereof by the computer device 800, the main memory 804 and the processing device 802 also constituting computer-readable storage media.

The computer-readable storage medium 824 can also be used to store model 190 and data used to train model 190. The computer readable storage medium 824 can also store a software library containing methods that call model 190. While the computer-readable storage medium 824 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing or encoding a set of instructions for execution by the machine and that cause the machine to perform any one or more of the methodologies of the present disclosure. The term "computer-readable storage medium" shall accordingly be taken to include, but not be limited to, solid-state memories, and optical and magnetic media.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure can be practiced without these specific details. In other instances, well-known components or methods are not described in detail or are presented in simple block diagram format in order to avoid unnecessarily obscuring the present disclosure. Thus, the specific details set forth are merely exemplary. Particular implementations can vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method can be altered so that certain operations can be performed in an inverse order so that certain operations can be performed, at least in part, concurrently with other operations. In another embodiment, instructions or sub-operations of distinct operations can be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:
providing, as input to a trained machine learning model, data associated with an amount of radio frequency (RF) power flowed through an electrical component of a current substrate support assembly during a current testing process performed for the substrate support assembly;
obtaining one or more outputs of the trained machine learning model;
extracting, from the one or more outputs, a measurement value for an electron flow across an impedance circuit of the current substrate support assembly;
assigning a quality rating to the current substrate support assembly based on whether the extracted measurement value for the electron flow satisfies an electron flow criterion, wherein:
responsive to determining that the extracted measurement value for the electron flow satisfies the electron flow criterion, a first quality rating is assigned to the current substrate support assembly; and
responsive to determining that the extracted measurement value for the electron flow does not satisfy the electron flow criterion, a second quality rating is assigned to the current substrate support assembly, wherein the first quality rating indicates a higher quality than the second quality rating; and
transmitting, to a client device, an indication of the assigned quality rating and an indication of whether the current substrate support assembly is to be installed at a processing chamber in view of the assigned first quality rating.

2. The method of claim 1, further comprising:
receiving the data associated with the RF power flowed through the electrical component from a testing fixture coupled to the current substrate support assembly, wherein the testing fixture is configured to simulate an electrode of a processing chamber of a manufacturing system flowing the RF power through the electrical component of the current substrate support assembly.

3. The method of claim 1, wherein the data associated with the RF power flowed through the electrical component comprises one or more scattering parameter values measured for the electrical component.

4. The method of claim 1, wherein the one or more outputs comprise: (i) a measurement value for a prior electron flow across a prior impedance circuit of a prior substrate support assembly during a prior testing process performed for the prior substrate support assembly, and (ii) a level of confidence that the current substrate support assembly being tested according to the current testing process is associated with the measurement value for the prior electron flow across the prior impedance circuit of the prior substrate support assembly.

5. The method of claim 4, wherein, extracting the measurement value for the electron flow for the current substrate support assembly comprises:
determining that the level of confidence satisfies a confidence criterion.

6. The method of claim 1, wherein the electrical component of the current substrate support assembly comprises an electrode of an electrostatic chuck or a heating element of the substrate support assembly.

7. The method of claim 1, wherein the impedance circuit of the current substrate support assembly is included as part of an auto capacitance tuner coupled to the current substrate support assembly.

8. The method of claim 1, wherein the trained machine learning model is trained with an input-output mapping comprising an input and an output, the input based on prior data associated with a prior amount of RF power flowed through a prior electrical component of a prior substrate support assembly during a prior testing process performed for the prior substrate support assembly, and the output identifying a prior measurement value for the electron flow across a prior impedance circuit of the prior substrate support assembly.

9. A system comprising:
a memory component configured to store a trained machine learning model; and
a processing device coupled to the memory component, the processing device to:
provide, as input to the trained machine learning model, data associated with an amount of radio frequency (RF) power flowed through an electrical component of a current substrate support assembly during a current testing process performed for the current substrate support assembly;
obtain one or more outputs of the trained machine learning model;
extract, from the one or more outputs, a measurement value for an electron flow across an impedance circuit of the current substrate support assembly;

assign a quality rating to the current substrate support assembly based on whether the extracted measurement value for the electron flow satisfies an electron flow criterion, wherein:
  responsive to determining that the extracted measurement value for the electron flow satisfies the electron flow criterion, a first quality rating is assigned to the current substrate support assembly; and
  responsive to determining that the extracted measurement value for the electron flow does not satisfy the electron flow criterion, a second quality rating is assigned to the current substrate support assembly, wherein the first quality rating indicates a higher quality than the second quality rating; and
transmit, to a client device, an indication of the assigned quality rating and an indication of whether the current substrate support assembly is to be installed at a processing chamber in view of the assigned quality rating.

10. The system of claim 9, wherein the processing device is further to
receive the data associated with the RF power flowed through the electrical component from a testing fixture coupled to the current substrate support assembly, wherein the testing fixture is configured to simulate an electrode of a processing chamber of a manufacturing system flowing the RF power through the electrical component of the current substrate support assembly.

11. The system of claim 9, wherein the data associated with the RF power flowed through the electrical component comprises one or more scattering parameter values measured for the electrical component.

12. The system of claim 9, wherein the one or more outputs comprise: (i) a measurement value for a prior electron flow across a prior impedance circuit of a prior substrate support assembly during a prior testing process performed for the prior substrate support assembly, and (ii) a level of confidence that the current substrate support assembly being tested according to the current testing process is associated with the measurement value for the prior electron flow across the prior impedance circuit of the prior substrate support assembly.

13. A non-transitory computer readable medium comprising instructions that, when executed by a processing device, cause the processing device to:
provide, as input to a trained machine learning model, data associated with an amount of radio frequency (RF) power flowed through an electrical component of a current substrate support assembly during a current testing process performed for the current substrate support assembly;
obtain one or more outputs of the trained machine learning model;
extract, from the one or more outputs, a measurement value for an electron flow across an impedance circuit of the current substrate support assembly;
assign a quality rating to the current substrate support assembly based on whether the extracted measurement value for the electron flow satisfies an electron flow criterion, wherein:
  responsive to determining that the extracted measurement value for the electron flow satisfies the electron flow criterion, a first quality rating is assigned to the current substrate support assembly; and
  responsive to determining that the extracted measurement value for the electron flow does not satisfy the electron flow criterion, a second quality rating is assigned to the current substrate support assembly, wherein the first quality rating indicates a higher quality than the second quality rating; and
transmit, to a client device, an indication of the assigned quality rating and an indication of whether the current substrate support assembly is to be installed at a processing chamber in view of the assigned quality rating.

14. The non-transitory computer readable medium of claim 13, wherein the processing device is further to:
receive the data associated with the RF power flowed through the electrical component from a testing fixture coupled to the current substrate support assembly, wherein the testing fixture is configured to simulate an electrode of a processing chamber of a manufacturing system flowing the RF power through the electrical component of the current substrate support assembly.

15. The method of claim 1, wherein the first quality rating indicates an effectiveness of the electrical component while the RF power is flowed through the electrical component.

16. The system of claim 9, wherein the first quality rating indicates an effectiveness of the electrical component while the RF power is flowed through the electrical component.

17. The non-transitory computer readable medium of claim 13, wherein the first quality rating indicates an effectiveness of the electrical component while the RF power is flowed through the electrical component.

* * * * *